(12) United States Patent
Yoshikawa

(10) Patent No.: US 6,313,681 B1
(45) Date of Patent: Nov. 6, 2001

(54) VARIABLE DELAY CIRCUIT

(75) Inventor: Kiyoshi Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/427,412

(22) Filed: Oct. 27, 1999

(30) Foreign Application Priority Data

Oct. 27, 1998 (JP) .................................................. 10-305942

(51) Int. Cl.[7] .................................................. H03H 11/26
(52) U.S. Cl. .......................... 327/277; 327/263; 327/291; 327/161; 327/176
(58) Field of Search .................................... 327/261, 263, 327/268, 276–278, 283, 285, 284, 290, 291, 172–176, 154, 161

(56) References Cited

U.S. PATENT DOCUMENTS 4,675,546 * 6/1987 Shaw ..................................... 327/176
5,594,377 * 1/1997 Choi et al. ............................ 327/278
5,684,423 * 11/1997 Koyashiki et al. ................... 327/263

FOREIGN PATENT DOCUMENTS 2-308619   12/1990  (JP) .
6-120785    4/1994  (JP) .
9-93098     4/1997  (JP) .
2000-49578  2/2000  (JP) .

* cited by examiner

*Primary Examiner*—Timothy P. Callahan
*Assistant Examiner*—Minh Nguyen

(57) ABSTRACT

A variable delay circuit has a positive logic variable delay circuit which delays an edge of a signal which is input through an input terminal and a negative logic variable delay circuit which delays an edge of the signal input through an input terminal. Only an edge delayed in accordance with the set time is extracted from all the edges of a signal supplied from the positive logic variable delay circuit and all the edges of a signal supplied from the negative logic variable delay circuit in an extracting circuit of the variable delay circuit.

13 Claims, 16 Drawing Sheets (a) DELAY TIME (L→H) vs SET POTENTIAL (b) DELAY TIME (H→L) vs SET POTENTIAL (c) DELAY TIME (L→H) vs SET POTENTIAL (d) DELAY TIME (H→L) vs SET POTENTIAL (e) DELAY TIME (L→H) vs SET POTENTIAL (f) DELAY TIME (H→L) vs SET POTENTIAL (a) DELAY TIME AT H→L EDGE vs SET POTENTIAL (b) DELAY TIME AT L→H EDGE vs SET POTENTIAL DUTY RATIO vs SET POTENTIAL

VARIABLE DELAY CIRCUIT

BACKGROUNDS OF THE INVENTION

1. Field of the Invention

The present invention relates to a variable delay circuit suitable for an LSI tester, and more particularly to a variable delay circuit improved in speed and accuracy.

2. Description of the Related Art

Recently, with the speed-up of semiconductor integrated circuits, there arises a demand for a more accurate LSI tester and there is an increase in the frequency to be dealt with. The performance of an LSI tester depends on the performance of a variable delay circuit integrated therewith.

FIG. 18 is a circuit diagram showing a conventional variable delay circuit. The conventional variable delay circuit is provided with two delay circuits DLY101 and DLY102 having the same structure. The delay circuit DLY101 comprises a ramp generator RG51, a comparator CP51 connected to the ramp generator RG51, an inverter IV51 connected to the comparator CP51, and a capacitive element C51 connected between the ramp generator RG51 and the comparator CP51.

The delay circuit DLY102 also comprises a ramp generator RG52, a comparator CP52, an inverter IV52, and a capacitive element C52. A signal line at the analog-output potential ANG51 is connected to the comparator CP51 and the comparator CP52. The ramp generator RG51 is connected to an input terminal DI51, the inverter IV52 is connected to an output terminal DO51, and the inverter IV51 is connected to the ramp generator RG52.

In the conventional variable delay circuit thus constituted, the delay circuit DLY101 of the first step delays the H→L edge of an input signal through the input terminal DI51 and the logic thereof is inverted by the inverter IV51. Next, the delay circuit DLY102 of the second step delays the H→L edge of the inverted signal, thereby delaying the L→H edge of the input signal through the input terminal DI51 in fact, and the logic thereof is inverted by the inverter IV52. The signal in which the H→L edge and L→H edge is delayed is supplied to the output terminal DO51. Generally, a delay circuit can only delay the H→L edge, which makes a signal inverted twice by the inverter IV51 and IV52 as mentioned above.

It is necessary to establish the analog-output potential ANG51 between the Lo level and Hi level output from the ramp generators RG51 and RG52, so as to invert the logic completely, with some margin enough to prevent from malfunction due to a noise. A delay setting signal is usually entered in digital form, and this digital signal is converted into an analog signal by a digital-to-analog converter (DAC: Digital-Analog Converter). In this case, since the analog signal will be varied accordingly to the change even if there is a change in the manufacturing process or power voltage, it is not necessary to consider any margin and the signal can be handled easily.

The conventional variable delay circuit, however, imposes a great restriction on the operating frequency in case of needing to achieve a high accuracy. This is why the proximity of L→H edge and H→L edge owing to the speed-up disturbs assurance of accuracy because the delay time is deviated by the effect of an overshoot. FIG. 19 is a timing chart showing a signal transferred within the conventional variable delay circuit. FIG. 20 is a graph showing the relationship therebetween with the analog output setting potential fixed as a horizontal axis and the delay time fixed as a vertical axis; FIG. 20(a) shows the H→L edge, and FIG. 20(b) shows the L→H edge. FIG. 21 is a graph showing the relationship therebetween with the analog output setting potential fixed as a horizontal axis and the duty ratio fixed as a vertical axis. In FIGS. 20(a) and (b) and FIG. 17, the analog output potential is lower at the right side.

In the above-mentioned conventional variable delay circuit, when the ramp generator RG51 receives L→H edge of a signal input through the input terminal DI51, the capacitive element C51 is immediately charged, with no generation of delay (node N51). The L→H edge is entered into the comparator CP51, L→H change occurs at the output side of the comparator CP51 (node N52). The edge is logically inverted by the inverter IV51 and the potential of the signal changes from H to L (node N53).

While, when the ramp generator RG51 receives H→L edge of a signal input through the input terminal DI51, the electric charge Q filled with the capacitive element C51 is gradually released by the constant-current power supply within the ramp generator RG51, thereby making a ramp waveform such as the potential gradually lowers (node N51). When the ramp waveform lowering at a constant gradient reaches the same potential as the analog output potential ANG51, the logic of the output of the comparator CP51 is inverted from H to L (node 52). Further, the edge is logically inverted by the inverter IV51 and the logic of the signal changes from L to H (node N53).

When the repeated waveform of L→H edge and H→L edge is entered into the input terminal DI51 and the signal output from the inverter IV51 is supplied to the delay circuit DLY102, the H→L edge is entered in the ramp generator RG52 during disturbance of the waveform at the L→H edge due to an overshoot. Therefore, discharge from the capacitive element C52 when the H→L linear waveform is entered in the ramp generator RG52 is started from the higher potential position or from the lower potential position than in the case where no overshoot occurs. Namely, the H→L linear waveform makes such a shape as moving in parallel vertically from the position where no overshoot occurs. Thus, the time when the H→L linear waveform reaches the same potential as the analog potential ANG51 is varied, thereby causing a change in the delay time as illustrated in FIGS. 20(a) and (b) and deteriorating the accuracy.

Since it is only at one edge that the delay time is varied by an overshoot, the duty ratio is varied according to the setting potential, as illustrated in FIG. 21. The L/H ratio of the output waveform of the delay circuit DLY101 is also varied according to the setting potential, thereby changing the influence of the overshoot in the delay circuit DLY102. This is the cause of deteriorating the linearity. It is a problem that the quality will be destroyed in order to speed up the performance.

SUMMARY OF THE INVENTION

An object of the present invention is to provide a variable delay circuit capable of preventing from deterioration of the duty ratio and the linearity in an output signal even if there occurs some edge whose delay time is deviated by an overshoot within a circuit, thereby setting the delay time at a high accuracy even if speeding up the performance.

According to one aspect of the invention, a variable delay circuit comprises an input terminal, a positive logic variable delay circuit for delaying an edge of a signal input through the input terminal, a negative logic variable delay circuit for delaying an edge of a signal input through the input terminal, and an extracting circuit for extracting only the edge delayed in accordance with set time from the edges of a signal supplied from the positive logic variable delay circuit and the edges of a signal supplied from the negative logic variable delay circuit.

According to the present invention, the edge of a signal input through the input terminal is delayed by a variable delay circuit of positive logic as well as delayed by a variable delay circuit of negative logic. From the edges supplied therefrom, only the edge delayed just according to the set time is extracted by an extracting circuit. Therefore, a delay circuit according to the present invention doesn't supply any edge whose delay time has been deviated due to an overshoot, thereby assuring a high accuracy even if speeding up.

In the preferred construction, the positive logic variable delay circuit includes delay time increasing means for making more than the set time, the delay time of an edge, varying from a low to high level, of a signal input through the input terminal, while the negative logic variable delay circuit includes delay time decreasing means for making less than the set time, the delay time of an edge, varying from a high to low level, of a signal input through the input terminal.

In another preferred construction, the extracting circuit is an OR circuit which computes OR of a signal supplied from the positive logic variable delay circuit and a signal supplied from the negative logic variable delay circuit.

In another preferred construction, the positive logic variable delay circuit includes delay time increasing means for making more than the set time, the delay time of an edge, varying from a low to high level, of a signal input through the input terminal, while the negative logic variable delay circuit includes delay time decreasing means for making less than the set time, the delay time of an edge, varying from a high to low level, of a signal input through the input terminal, the delay time increasing means and the delay time decreasing means respectively including a capacitive element and adjusting the delay time by setting the capacity of the capacitive element.

In another preferred construction, the positive logic variable delay circuit includes a first delay circuit for delaying an edge, varying from a high to low level, of a signal input through the input terminal and supplying the logic being inverted, and a second delay circuit for delaying an edge, varying from a high to low level, of a signal supplied from the first delay circuit and supplying the logic being inverted, while the negative logic variable delay circuit includes a first inverter for inverting the logic of a signal input through the input terminal, a third delay circuit for delaying an edge, varying from a high to low level, of a signal supplied from the first inverter and supplying the logic being inverted, a fourth delay circuit for delaying an edge, varying from a high to low level, of a signal supplied from the third delay circuit and supplying the logic being inverted, and a second inverter for inverting the logic of a signal supplied from the fourth delay circuit.

In another preferred construction, the positive logic variable delay circuit includes a buffer whose operating speed is equal to the addition of the operating speed of the first inverter and that of the second inverter.

In another preferred construction, the positive logic variable delay circuit includes delay time increasing means for making more than the set time, the delay time of an edge, varying from a low to high level, of a signal input through the input terminal, a first delay circuit for delaying an edge, varying from a high to low level, of a signal input through the input terminal and supplying the logic being inverted, and a second delay circuit for delaying an edge, varying from a high to low level, of a signal supplied from the first delay circuit and supplying the logic being inverted, while the negative logic variable delay circuit includes delay time decreasing means for making less than the set time, the delay time of an edge, varying from a high to low level, of a signal input through the input terminal, a first inverter for inverting the logic of a signal input through the input terminal, a third delay circuit for delaying an edge, varying from a high to low level, of a signal supplied from the first inverter and supplying the logic being inverted, a fourth delay circuit for delaying an edge, varying from a high to low level, of a signal supplied from the third delay circuit and supplying the logic being inverted, and a second inverter for inverting the logic of a signal supplied from the fourth delay circuit.

In another preferred construction, the delay time increasing means and the delay time decreasing means respectively including a capacitive element and adjusting the delay time by setting the capacity of the capacitive element.

In another preferred construction, the positive logic variable delay circuit includes a first delay circuit for delaying an edge, varying from a high to low level, of a signal input through the input terminal and supplying the logic being inverted, and a second delay circuit for delaying an edge, varying from a high to low level, of a signal supplied from the first delay circuit and supplying the logic being inverted, while the negative logic variable delay circuit includes a first inverter for inverting the logic of a signal input through the input terminal, a third delay circuit for delaying an edge, varying from a high to low level, of a signal supplied from the first inverter and supplying the logic being inverted, a fourth delay circuit for delaying an edge, varying from a high to low level, of a signal supplied from the third delay circuit and supplying the logic being inverted, and a second inverter for inverting the logic of a signal supplied from the fourth delay circuit, the first delay circuit having a first capacitive element which is charged upon receipt of an edge varying from a low to high level, and a first constant-current power for discharging the first capacitive element upon receipt of an edge varying from a high to low level, the second delay circuit having a second capacitive element which is charged upon receipt of an edge varying from a low to high level, and a second constant-current power for discharging the second capacitive element upon receipt of an edge varying from a high to low level, the third delay circuit having a third capacitive element which is charged upon receipt of an edge varying from a low to high level, and a third constant-current power for discharging the third capacitive element upon receipt of an edge varying from a high to low level, the fourth delay circuit having a fourth capacitive element which is charged upon receipt of an edge varying from a low to high level, and a fourth constant-current power for discharging the fourth capacitive element upon receipt of an edge varying from a high to low level.

In another preferred construction, the capacity of the first capacitive element is equal to that of the fourth capacitive element, the current of the first constant-current power is equal to that of the third constant-current power, the current of the second constant-current power is smaller than that of the first constant-current power and the third constant-current power, and the current of the fourth constant-current power is greater than that of the first constant-current power and the third constant-current power.

In another preferred construction, the extracting circuit consists of a first fixed delay circuit for generating a constant delay on a signal supplied from the positive logic variable delay circuit, an OR circuit for calculating OR of a signal supplied from the first fixed delay circuit and a signal supplied from the negative logic variable delay circuit, a second fixed delay circuit for generating the constant delay on a signal supplied from the OR circuit, and an AND circuit for calculating AND of a signal supplied from the second fixed delay circuit and a signal supplied from the OR circuit.

Also, the positive logic variable delay circuit includes delay time increasing means for making more than the set time, the delay time of an edge, varying from a low to high level, of a signal input through the input terminal, while the negative logic variable delay circuit includes delay time decreasing means for making less than the set time, the delay time of an edge, varying from a high to low level, of a signal input through the input terminal, and the extracting circuit consists of a first fixed delay circuit for generating a constant delay on a signal supplied from the positive logic variable delay circuit, an OR circuit for calculating OR of a signal supplied from the first fixed delay circuit and a signal supplied from the negative logic variable delay circuit, a second fixed delay circuit for generating the constant delay on a signal supplied from the OR circuit, and an AND circuit for calculating AND of a signal supplied from the second fixed delay circuit and a signal supplied from the OR circuit.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 2(a) is a timing chart showing the minimum value of the Hi potential of the ramp waveform, and FIG. 2(b) is a timing chart showing the maximum value of Hi potential of the ramp waveform;

DESCRIPTION OF THE PREFERRED EMBODIMENT

Figure 1:
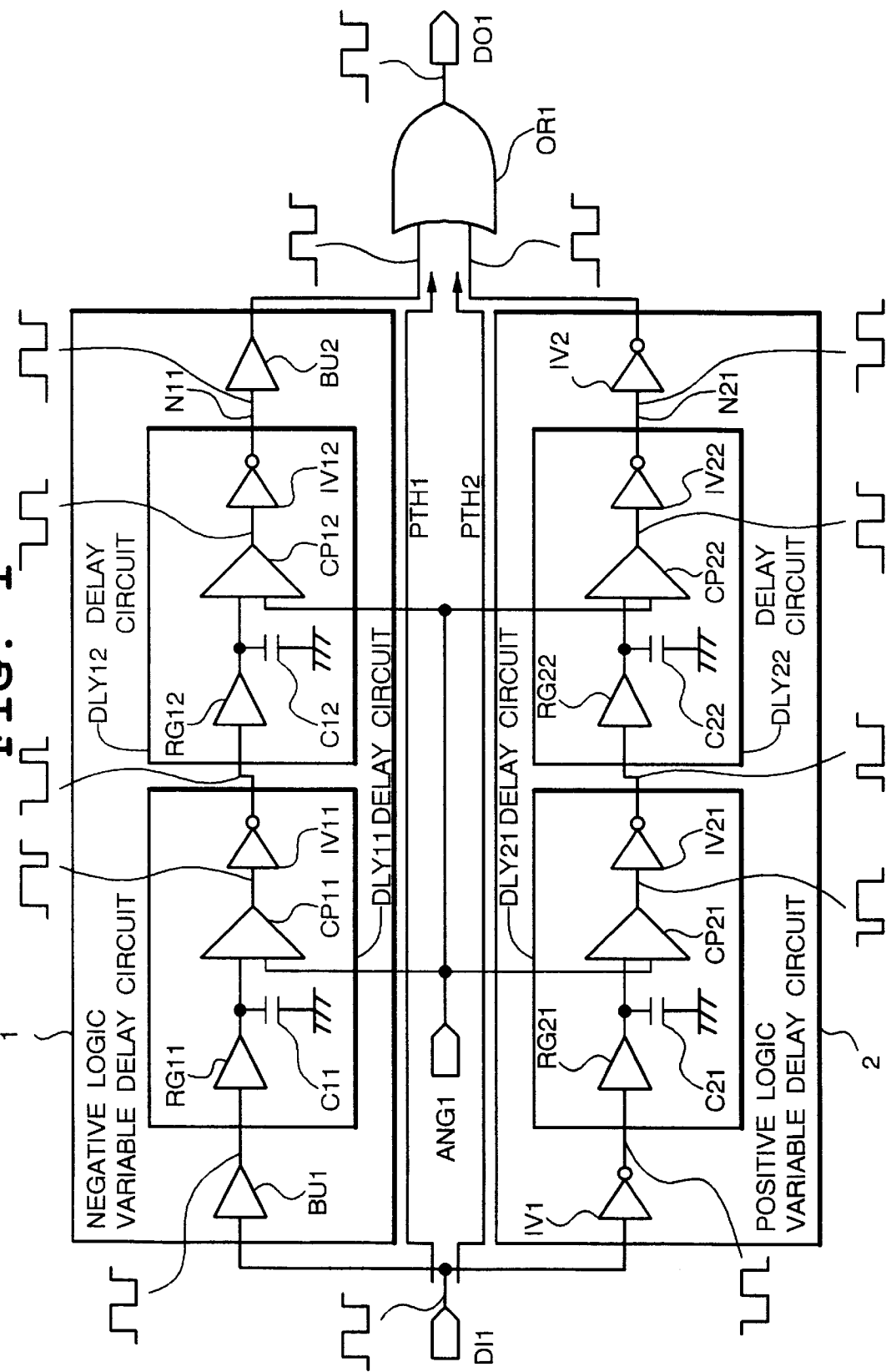
FIG. 1 is a circuit diagram showing a variable delay circuit in accordance with a first embodiment of the present invention.

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention. FIG. 1 is a circuit diagram showing a variable delay circuit according to a first embodiment of the present invention.

A variable delay circuit of negative logic 1 and a variable delay circuit of positive logic 2 are provided in the variable delay circuit of the present invention. The negative logic variable delay circuit 1 comprises two buffers BU1 and BU2 and two delay circuits DLY11 and DLY12, and the positive logic variable delay circuit 2 comprises two inverters IV1 and IV2 and two delay circuits DLY21 and DLY22.

The delay circuit DLY11 includes a ramp generator RG11, a comparator CP11 whose input side is connected to the output side of the ramp generator RG11, an inverter IV11 whose input side is connected to the output side of the comparator CP11, and a capacitive element C11 connected between the output side of the ramp generator RG11 and the input side of the comparator CP11. Similarly, the delay circuit DLY12 includes a ramp generator RG12, a comparator CP12, an inverter IV12, and a capacitive element C12. The delay circuit DLY21 includes a ramp generator RG21, a comparator CP21, an inverter IV21, and a capacitive element C21. The delay circuit DLY22 includes a ramp generator RG22, a comparator CP22, an inverter IV22, and a capacitive element C22. A signal line at the analog output potential ANG1 is connected to each input side of the comparators CP11, CP12, CP21, and CP22.

An input terminal DI1 is connected to each input side of the buffer BU1 and the inverter IV1, the output side of the buffer BU1 is connected to the input side of the ramp generator RG11, and the output side of the inverter IV1 is connected to the input side of the ramp generator RG21. Further, the output side of the inverter IV11 is connected to the input side of the ramp generator RG12, and the output side of the inverter IV21 is connected to the input side of the ramp generator RG22.

While, an output terminal DO1 is connected to the output side of an OR circuit OR1, and the input side of the OR circuit CR1 is connected to the output side of the buffer BU2 and the output side of the inverter IV2. The input side of the buffer BU2 is connected to the output side of the inverter IV12, and the input side of the inverter IV2 is connected to the output side of the inverter IV22.

The operating speed of the respective buffers BU1 and BU2 and inverters IV1 and IV2 is the same. The buffers BU1 and BU2 are provided for the same number as the inverters IV1 and IV2 and as the variable delay circuits. This is why the operation of the inverters IV1 and IV2 eliminates the timing deviation occurring between the negative logic variable delay circuit 1 and the positive logic variable delay circuit 2.

If the operating speed of the buffer BU1 is the same as the addition of the operating speed of the inverter IV1 and the operating speed of the inverter IV2, the buffer BU2 is not necessary. Similarly, when the operating speed of the buffer BU2 is the same as the addition of the operating speed of the inverter IV1 and the operating speed of the inverter IV2, the buffer BU1 is not necessary.

This time, the capacity of the capacitive elements C11, C12, C21, and C22 provided within the variable delay circuits DLY11, DLY12, DLY21, and DLY22 will be described.

Since a change in the delay time due to an overshoot occurs only at one edge, the duty ratio varies also in the variable delay circuit constituted as mentioned above. In the negative logic variable delay circuit 1, an edge to be affected by an overshoot is the L→H edge, and in the positive logic variable delay circuit 2, an edge to be affected by this is the H→L edge of a pulse wave input through the input terminal DI1. While, the H→L edge in the positive logic variable delay circuit 1 and the L→H edge in the positive logic variable delay circuit 2 won't be affected by an overshoot.

In the embodiment, the output of the negative logic variable delay circuit 1 is OR-connected to the output of the positive logic variable delay circuit 2, thereby supplying only the edge not affected by an overshoot. If only OR-connection, there is a fear that the edge affected by an overshoot may appear in the output terminal depending on some timing. Therefore, in the embodiment, by adjusting the capacity of the capacitive element, an edge appearing in the output terminal is restricted to an edge not affected by an overshoot.

An edge affected by an overshoot appears, when the negative logic variable delay circuit 1 is affected by an overshoot so that the delay time of the L→H edge may be less than the set time and the positive logic variable delay circuit 2 is affected by an overshoot so that the delay time of the H→L edge may be more than the set time.

Therefore, previously making a difference to the set values for the respective delay time of these two edges, prevents an edge affected by an overshoot from appearing in the output at the OR calculation. More specifically, the delay of the L→H edge in the negative logic variable delay circuit 1 is set larger than the set time, while the delay of the H→L edge in the positive logic variable delay circuit 2 is set smaller than the set time. As a way of making a difference to the delays as the above, the capacity of the capacitive element C12 within the delay circuit DLY12 is set greater than the capacity of the capacitive element C11, while the capacity of the capacitive element C22 within the delay circuit DLY22 is set smaller than the capacity of the capacitive element C21. The capacity of the capacitive element C11 is equal to the capacity of the capacitive element C21.

The difference between these capacitive elements affects the charging time of the capacitive elements C12 and C22 in a degree. The amount is proportional to the value obtained by multiplying the capacitor charging current 1/hFE flowing into the capacitive element charging transistor by the output impedance of the ramp generators RG12 and RG22. The effect on the charging time is very a little compared with the change amount of the delay due to an overshoot, and it is no problem. In case of requiring a delay circuit of higher accuracy, however, this difference becomes a problem; therefore, it is necessary to select the capacity of the capacitive element carefully.

Figure 2:
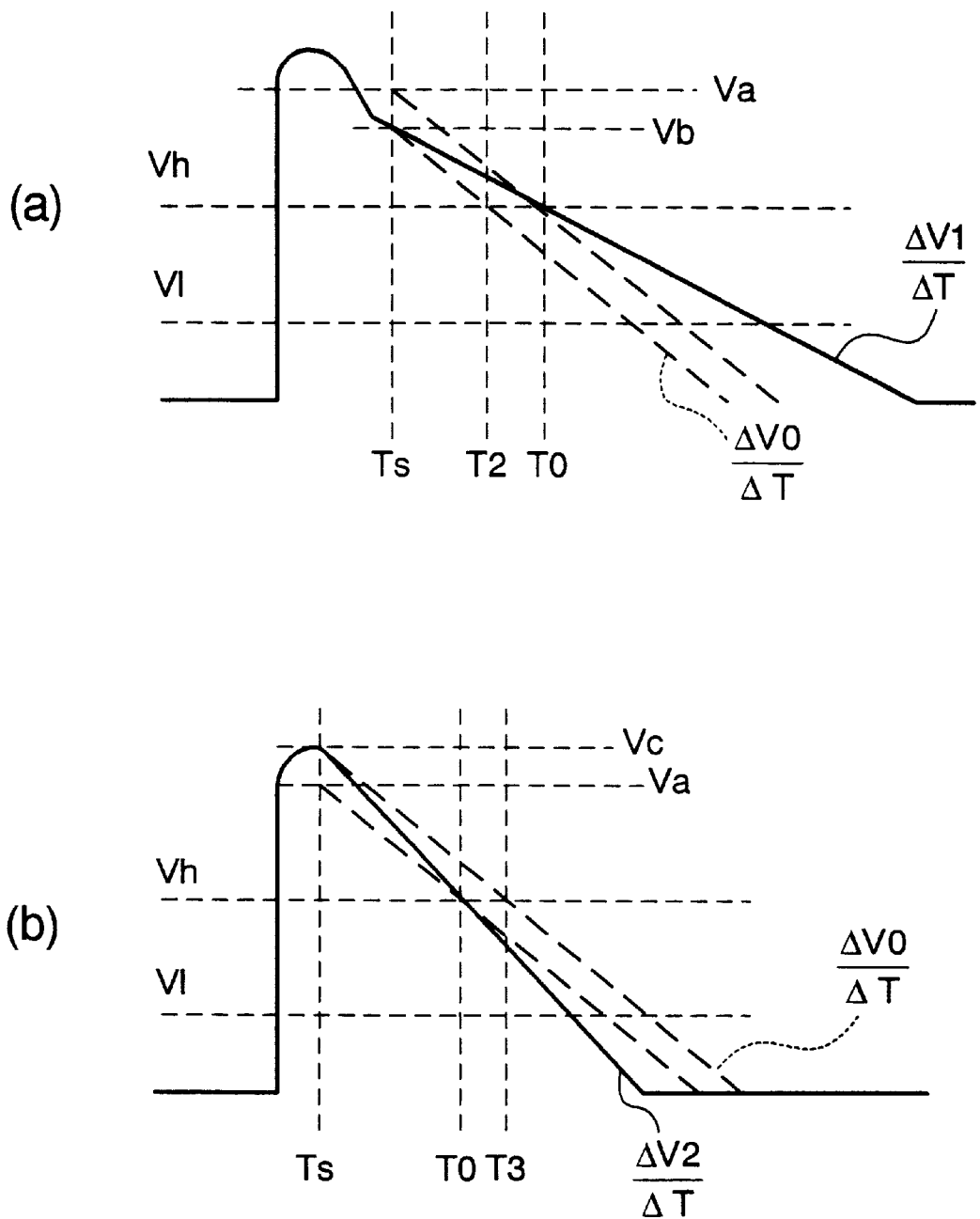
FIG. 2 is a timing chart showing the Hi potential of the ramp waveform in case of having an overshoot effect.

FIG. 2(a) is a timing chart showing the minimum value of Hi potential of ramp waveform in case of having an effect of an overshoot, and FIG. 2(b) is a timing chart showing the maximum value of Hi potential of ramp waveform in case of having an effect of an overshoot.

In FIGS. 2(a) and 2(b), the potential Va designates the Hi potential of ramp waveform in case of having no effect of an overshoot, the potential Vb designates the minimum value of the Hi potential of ramp waveform in case of having an effect of an overshoot, the potential Vc designates the maximum value of the Hi potential of ramp waveform in case of having an effect of an overshoot, the potential Vh designates the highest level of the analog output potential ANG1, and the potential Vl designates the lowest level of the analog output potential ANG1. The time Ts designates the change starting time when the potential of a ramp waveform starts changing from Hi to Lo, the time T0 designates the time when the ramp waveform reaches the potential Vh in case of having no effect of an overshoot, the time T2 designates the time when the potential reaches the potential Vh at the start of the ramp waveform from the potential Vb at the time Ts in case of having an effect of an overshoot, and the time T3 is the time when the potential reaches the potential Vh at the start of the ramp waveform from the potential Vc at the time Ts in case of having an effect of an overshoot.

The formula $\Delta V0/\Delta T$ is the gradient of the ramp waveform when the capacity of the respective capacitive elements C12 and C22 is the same as that of the respective capacitive elements C11 and C21, the formula $\Delta V1/\Delta T$ is the gradient of the ramp waveform when the capacity of the capacitive element C12 is larger than that of the respective capacitive elements C11 and C21, and the formula $\Delta V2/\Delta T$ is the gradient of the ramp waveform when the capacity of the capacitive element C22 is smaller than that of the respective capacitive elements C11 and C21.

The following expressions (1) and (2) show the necessary condition for preventing a problem generated at the start of H→L change of the ramp waveform from the potential Vb in the positive logic variable delay circuit 1 as well as a problem generated at the start of a change from the potential Vc in the negative logic variable delay circuit 2, from appearing in the output of the OR circuit.

$$Vb-|\Delta V1/\Delta T|\times(T0-Ts)\geq Va-|\Delta V0/\Delta T|\times(T0-Ts) \quad (1)$$

$$Vc-|\Delta V2/\Delta T|\times(T0-Ts)\leq Va-|\Delta V0/\Delta T|\times(T0-Ts) \quad (2)$$

Where, the current of the constant-current power is defined as i, the capacity of the respective capacitive elements C11 and C21 is defined as C0, the capacity of the capacitive element C12 is defined as C1, the capacity of the capacitive element C22 is defined as C2, the electric charge amount released from the capacitive elements C11 and C21 by the constant-current power during a small hour $\Delta T$ is defined as $\Delta Q0$, the potential change amount of the electric charge amount of the capacitive elements C11 and C21 changing by $\Delta Q0$ during the small hour $\Delta T$ is defined as $\Delta V0$, the electric charge amount released from the capacitive element C12 by the constant-current power during the small hour $\Delta T$ is defined as $\Delta Q1$, the potential change amount of the electric charge amount of the capacitive element C12 changing by $\Delta Q1$ during the small hour $\Delta T$ is defined as $\Delta V1$, the electric charge amount released from the capacitive element C22 by the constant-current power during the small hour $\Delta T$ is defined as $\Delta Q2$, and the potential change amount of the electric charge amount of the capacitive element C22 changing by $\Delta Q2$ during the small hour $\Delta T$ is defined as $\Delta V2$, when the following expressions (3) to (5) hold.

$$\Delta V0=\Delta Q0/C0=i\Delta T/C0 \quad (3)$$

$$\Delta V1=\Delta Q1/C1=i\Delta T/C1 \quad (4)$$

$$\Delta V2=\Delta Q2/C2=i\Delta T/C2 \quad (5)$$

Thus, each gradient is shown by the following expressions (6) to (8).

$$|\Delta V0/\Delta T|=i/C0 \quad (6)$$

$$|\Delta V1/\Delta T|=i/C1 \quad (7)$$

$$|\Delta V2/\Delta T|=i/C2 \quad (8)$$

The following expressions (9) and (10) are obtained based on the expressions (1) and (2) and the expressions (6) to (8).

$$Vb-i/C1\times(T0-Ts)\geq Va-i/C0\times(T0-Ts) \quad (9)$$

$$Vc-i/C2\times(T0-Ts)\leq Va-i/C0\times(T0-Ts) \quad (10)$$

The relation as shown in the following expressions (11) and (12) is obtained by solving the expressions (9) and (10) as for C1 and C2.

$$C1\geq 1/[(Vb-Va)/\{i\times(T0-Ts)\}+1/C0] \quad (11)$$

$$C2\leq 1/[(Vc-Va)/\{i\times(T0-Ts)\}+1/C0] \quad (12)$$

In a variable delay circuit of high accuracy extremely depending on the capacity of the charging current of the capacitive element as mentioned above, it is desirable that the respective capacities C1 and C2 are as shown by the following expressions (13) and (14).

$$C1=1/[(Va-Vb)/\{i\times(T0-Ts)\}+1/C0] \quad (13)$$

$$C2=1/[(Va-Vc)/\{i\times(T0-Ts)\}+1/C0] \quad (14)$$

Figure 3:
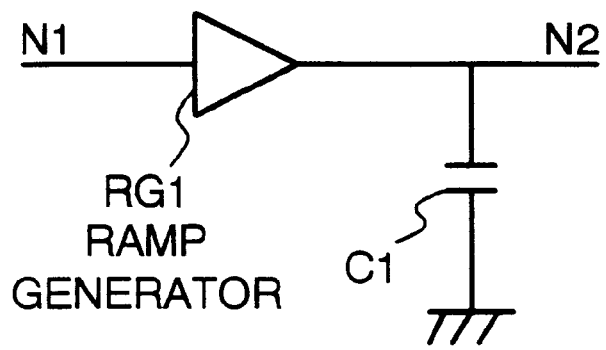
FIG. 3 is a circuit diagram showing the structure of a ramp generator.

This time, the ramp generator, comparator, buffer, and inverter integrated in this embodiment and the OR circuit will be explained. FIG. 3 is a circuit diagram showing the ramp generator, and FIG. 4 is a view showing an example of a circuit in which the description of the circuit diagram shown in FIG. 3 is enlarged to an element level.

The ramp generators RG11, RG12, RG21, and RG22 integrated in this embodiment respectively have the same structure. Here, they are described as a ramp generator RG1 to which the capacitive element C1 having the same structure is connected.

Figure 4:
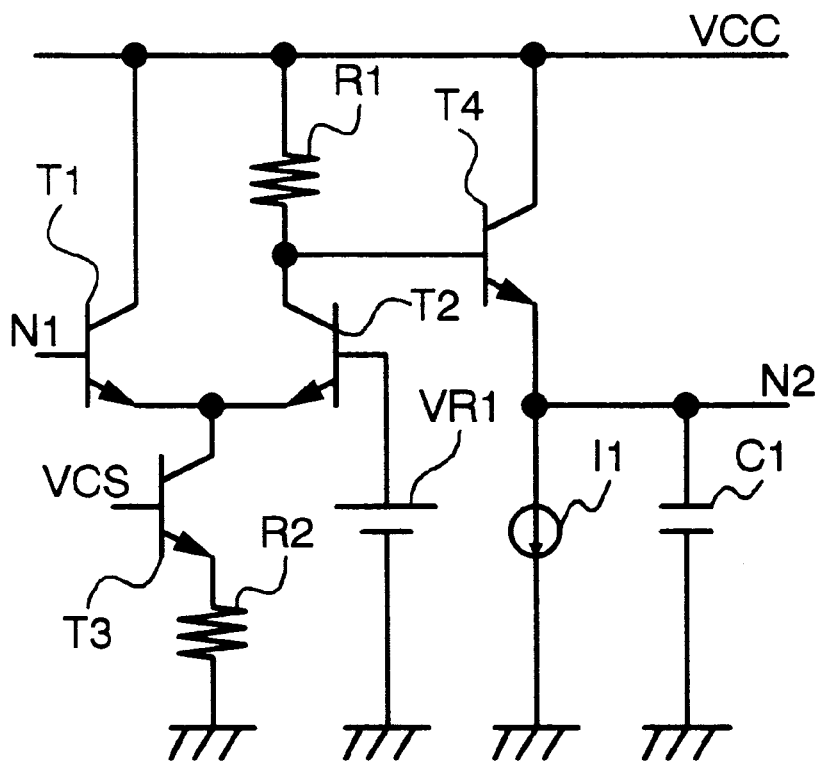
FIG. 4 is a view showing an example of a circuit where the description of the circuit diagram shown in FIG. 3 is enlarged to en element level.

Transistors T1 and T2 whose emitters are connected to each other are provided in the ramp generator RG1 as illustrated in FIG. 4. These emitters are connected to a collector of the transistor T3. The voltage VCS is applied to the base of the transistor T3 and its emitter is connected to the resistor R2. The base of the transistor T2 is connected to the constant-voltage power VR1.

The collector of the transistor T2 is connected to the resistor R1 and the base of the transistor T4. Further, the other end of the resistor R1 and the collectors of the transistors T1 and T4 are connected to a power cord at the power voltage VCC. The emitter of the transistor T4 is connected to the constant-current power I1 and the capacitive element C1.

The base of the transistor T1 is connected to the outside of the delay circuit, and the emitter of the transistor T4 is connected to the comparator within the delay circuit.

Figure 5:
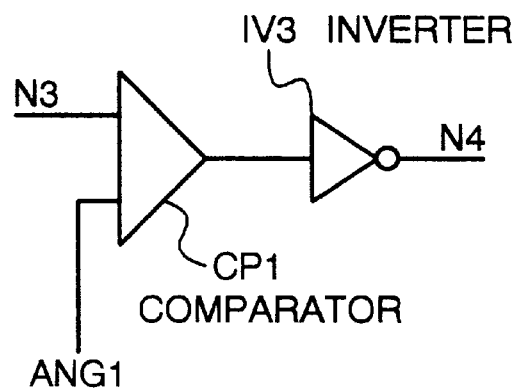
FIG. 5 is a circuit diagram showing the comparator.
Figure 6:
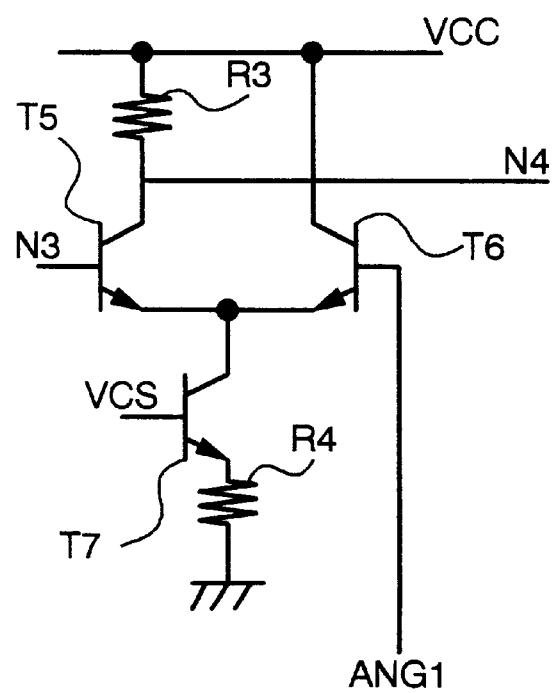
FIG. 6 is a view showing an example of a circuit where the description of the circuit diagram shown in FIG. 5 is enlarged to an element level.

The comparators CP11, CP12, CP21, and CP22 integrated in the embodiment have the same structures as a complementary comparator. FIG. 5 is a circuit diagram showing the comparator, and FIG. 6 is a view showing an example of a circuit in which the description of the circuit diagram shown in FIG. 5 is enlarged to an element level. Here, the description will be made, by way of example of a comparator CP1 having the same structure as the above, to which the inverter IV3 having a logical inversion function is connected to.

The comparator CP1 is provided with the transistors T5 and T6 whose emitters are connected to each other as illustrated in FIG. 6. The collector of the transistor T7 is connected to these emitters. The voltage VCS is applied to the base of the transistor T7 and its emitter is connected to the resistor R4. The base of the transistor T6 is connected to a power cord at the analog output potential ANG1.

The collector of the transistor T5 is connected to the resistor R3. The other end of the resistor R3 and the collector of the transistor T6 are connected to a power cord at the power voltage VCC.

The base of the transistor T5 is connected to the ramp generator within the delay circuit, and the emitter of the transistor T5 is connected to the outside of the delay circuit.

The buffer BU1 and the inverter IV1 connected to the input terminal integrated in this embodiment are complementary buffer and inverter. If the inverter IV1 for logic inversion and the buffer BU1 for timing adjustment which are connected to the input terminal are constituted as shown in FIG. 1, the size of the circuit will become large. However, by use of complementary ones, both the positive logic and the negative logic can be obtained at the best timing.

When a complementary buffer is adopted to a comparator for logical inversion in the output unit of the negative logic variable delay circuit 2, it has only to replace the two wires for complementary signals, and the buffer BU2 for timing adjustment at the side of the positive logic is not necessary, thereby to simplify the circuit.

Figure 7:
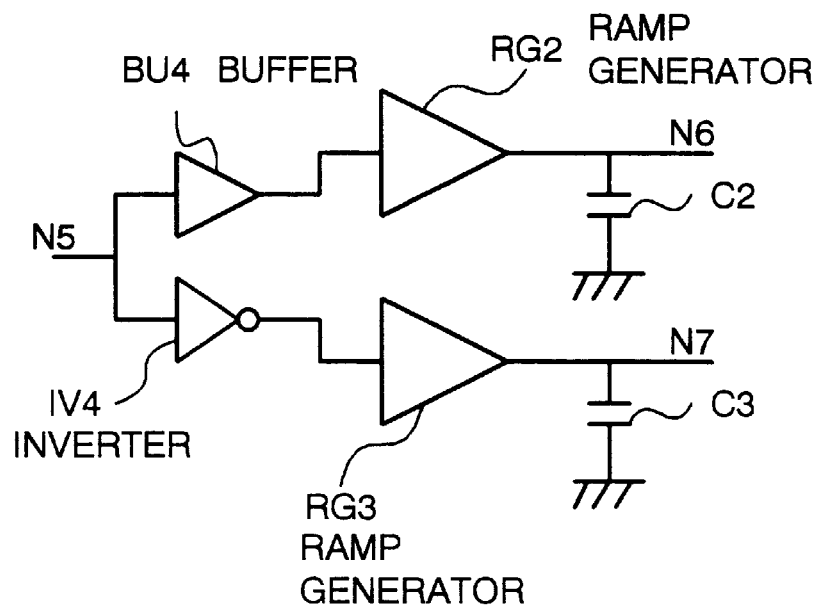
FIG. 7 is a circuit diagram showing a complementary buffer and inverter.
Figure 8:
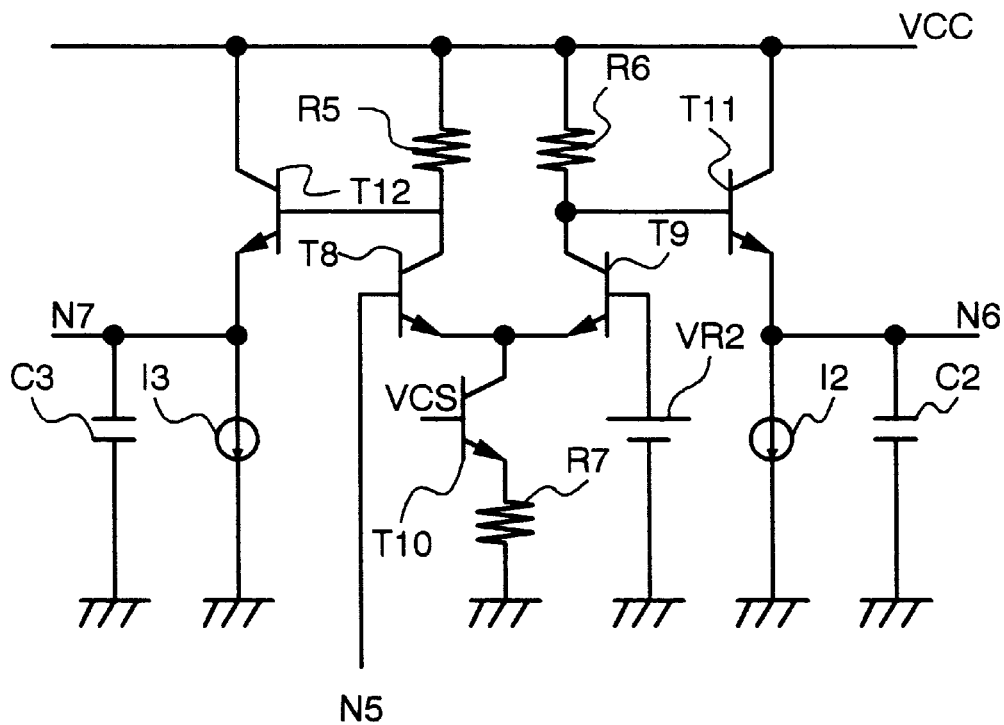
FIG. 8 is a view showing an example of a circuit where the description of the circuit diagram shown in FIG. 7 is enlarged to an element level.

FIG. 7 is a circuit diagram showing the complementary buffer and inverter, and FIG. 8 is a view showing an example of a circuit in which the description of the circuit diagram shown in FIG. 7 is enlarged to an element level. Here, the complementary buffer BU4 and inverter IV4, to which the ramp generators RG2 and RG3 and the capacitive elements C2 and C3 within the variable delay circuit having the same structure as mentioned above are connected, will be described.

The complementary buffer BU4 and inverter IV4 are provided with the transistors T8, T9, T10, and T11, the resistors R6 and R7, the constant-voltage power VR2, the constant-current power I2, and the capacitive element C2, which are connected in the same way as that of the ramp generator 1 shown in FIG. 4. The resistor R5 is provided symmetrically to the resistor R6, the transistor T12 is provided symmetrically to the transistor T11, the constant-current power I3 is provided symmetrically to the constant-current power I2, and the capacitive element C3 is provided symmetrically to the capacitive element C2.

The base of the transistor T8 is connected to the input terminal, and the emitters of the transistor T11 and T12 are respectively connected to the comparators within the delay circuit.

Figure 9:
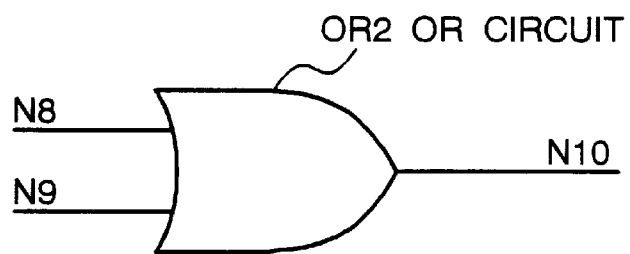
FIG. 9 is a circuit diagram showing an OR circuit.
Figure 10:
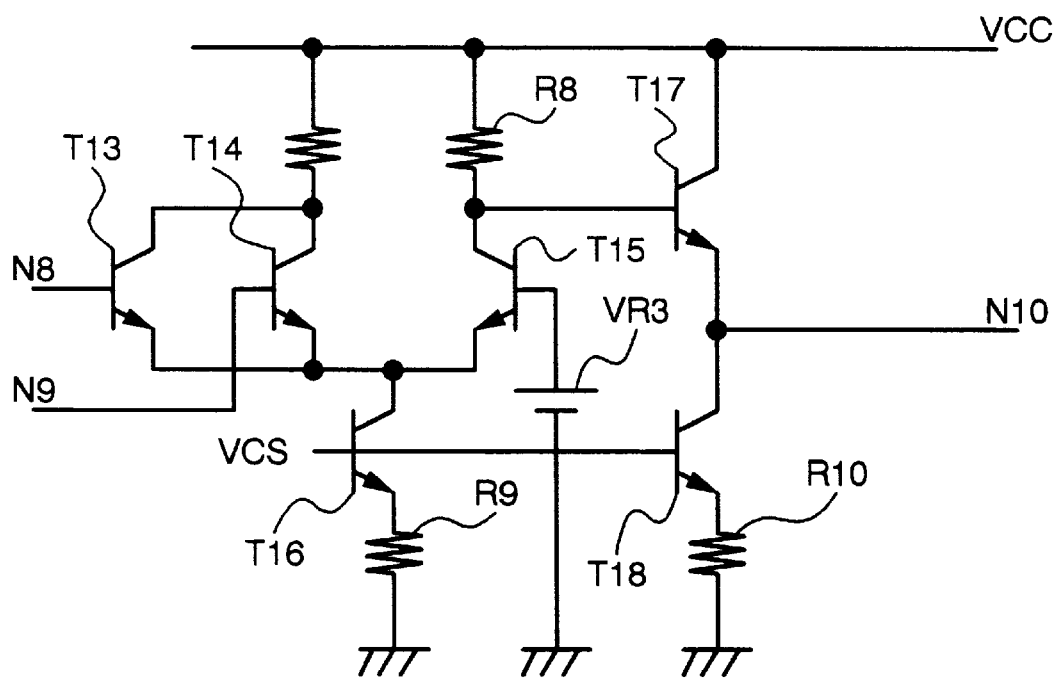
FIG. 10 is a view showing an example of a circuit where the description of the circuit diagram shown in FIG. 9 is enlarged to an element level.

FIG. 9 is a circuit diagram showing the OR circuit, and FIG. 10 is a view showing an example of a circuit in which the description of the circuit diagram shown in FIG. 9 is enlarged to an element level. The OR circuit OR2 having the same structure as the OR circuit OR1 will be described.

The OR circuit OR2 is provided with the transistors T13 and T14 including collectors and emitters connected to each other, as illustrated in FIG. 10. The emitter of the transistor T15 and the collector of the transistor T16 are respectively connected to these emitters. The voltage VCS is applied to the base of the transistor T16 and the resistor R9 is connected to the emitter of the transistor T16. While, the constant-current power VR3 is connected to the base of the transistor T15, and the resistor R8 and the base of the transistor T17 are respectively connected to the collector thereof. The other end of the resistor R8 and the collectors of the transistors T13, T14, and T17 are respectively connected to a power cord at the power potential VCC.

Further, the collector of the transistor T18 is connected to the emitter of the transistor T17. The voltage VCS is applied to the base of the transistor T18 similarly to the case of the transistor T16, and the emitter of the transistor T18 is connected to the resistor R10.

The base of the transistor T13 is connected to the positive logic variable delay circuit, while the base of the transistor T14 is connected to the negative logic variable delay circuit. The emitter of the transistor T17 is connected to the output terminal.

The operation of the variable delay circuit of the embodiment constituted as mentioned above will be described. A signal to be transferred via a path PTH1 in the positive logic variable delay circuit 1 will be described at first.

When the L→H edge of a pulse wave input through the input terminal DI1 is supplied through the buffer BU1 to the ramp generator RG11, the capacitive element C11 is immediately charged, with no generation of delay. The L→H edge is supplied to the comparator CP11, and at the output side of the comparator CP11 there arises the L→H change. The edge is logically inverted by the inverter IV11 and the logic of the signal changes from H to L.

When the ramp generator RG11 receives the H→L edge of the pulse wave input through the input terminal DI1, the electric charge Q stored in the capacitive element C11 is gradually released by the constant-current power within the ramp generator RG11, thereby to obtain such a ramp waveform that the potential is gradually falling down. At this time, when the current value from the constant-current power is defined as i0, the potential at the input side of the comparator CP11 is expressed as (Q–i0×T). Namely, the potential linearly falls down according to elapse of the time T.

Therefore, changing the analog output potential ANG1 of the comparator CP11 at a constant interval enables the delay time to change linearly. When the ramp waveform falling down at a constant gradient reaches the same potential as the analog output potential ANG1 of the digital-to-analog converter (DAC) as mentioned above, the logic of the output from the comparator CP11 is inverted to change from H to L. Further, the edge is logically inverted by the inverter IV11 and the logic of the signal changes from L to H.

The output waveform from the inverter IV11 when the L→H edge and H→L edge are repeatedly entered there becomes the pulse waveform whose Hi side is narrow as illustrated in FIG. 1. In the delay circuit DLY11, only the H→L edge is delayed, and the H→L edge is not affected by an overshoot.

This time, when a signal having the pulse waveform whose Hi side is narrow, the pulse waveform being supplied from the inverter IV11 after entering the repeated waveforms of the L→H edge and H→L edge into the input terminal DI1, is supplied to the delay circuit DLY12, the H→L edge is entered in the ramp generator RG12 during the waveform disturbance due to the overshoot at the L→H edge. Therefore, discharge from the capacitive element C12 when the H→L linear waveform is supplied to the ramp generator RG12 starts at a higher potential or lower potential compared with the case where no overshoot occurs. Namely, the H→L linear waveform becomes such a shape as moving in parallel vertically from the position where no overshoot occurs. This changes the time when the H→L linear waveform reaches the same potential as the analog potential ANG1, thereby changing the delay time.

In this embodiment, since the capacity C1 of the capacitive element C12 is arranged to be larger than the capacity C0 of the capacitive element C11, the waveform is not the parallel moved waveform but it has such a shape that the gradient becomes greater. In other words, since the capacity C1 satisfies the expression 11, even if there is an effect of an overshoot, the time when the ramp waveform reaches the analog output potential ANG1 becomes later than the time T0.

In the path PTH2 of the negative logic variable delay circuit 2, though some delay occurs at the H→L edge in the delay circuit DLY21 in the same way as in the positive logic variable delay circuit 1, since the logic of a signal input to the delay circuit DLY21 is inverted by the inverter IV1, the H→L edge in the delay circuit DLY21 corresponds to the L→H edge in the input terminal DI1. This edge is an edge not affected by an overshoot. Similarly to the positive logic variable delay circuit 1, when the L→H edge and H→L edge are repeatedly entered there, the output waveform from the delay circuit DLY21 becomes the pulse waveform whose Hi side is narrow. This is supplied to the delay circuit DLY22, where the H→L edge is affected by an overshoot.

In this embodiment, since the capacity C2 of the capacitive element C22 is arranged to be smaller than the capacity C0 of the capacitive element C21, the waveform is not the parallel moved waveform, but it has such a shape that the gradient becomes smaller. In other words, since the capacity C2 satisfies the expression 12, even if there is an effect of an overshoot, the time when the ramp waveform reaches the analog potential ANG1 becomes earlier than the time T0. Since the logic is inverted in the output unit of the negative logic variable delay circuit 2 and supplied therefrom, finally, the L→H edge is correctly delayed and the H→L edge affected by an overshoot is less delayed.

The operation of the OR circuit OR1 will be described this time. In the ordinal OR circuit, some difference of timing occurs due to difference between the L→H edge and H→L edge and difference in the input terminals. Generally, the OR circuit is not suitable for use in a circuit, like a variable delay circuit, where the timing is the most important factor.

Figure 11:
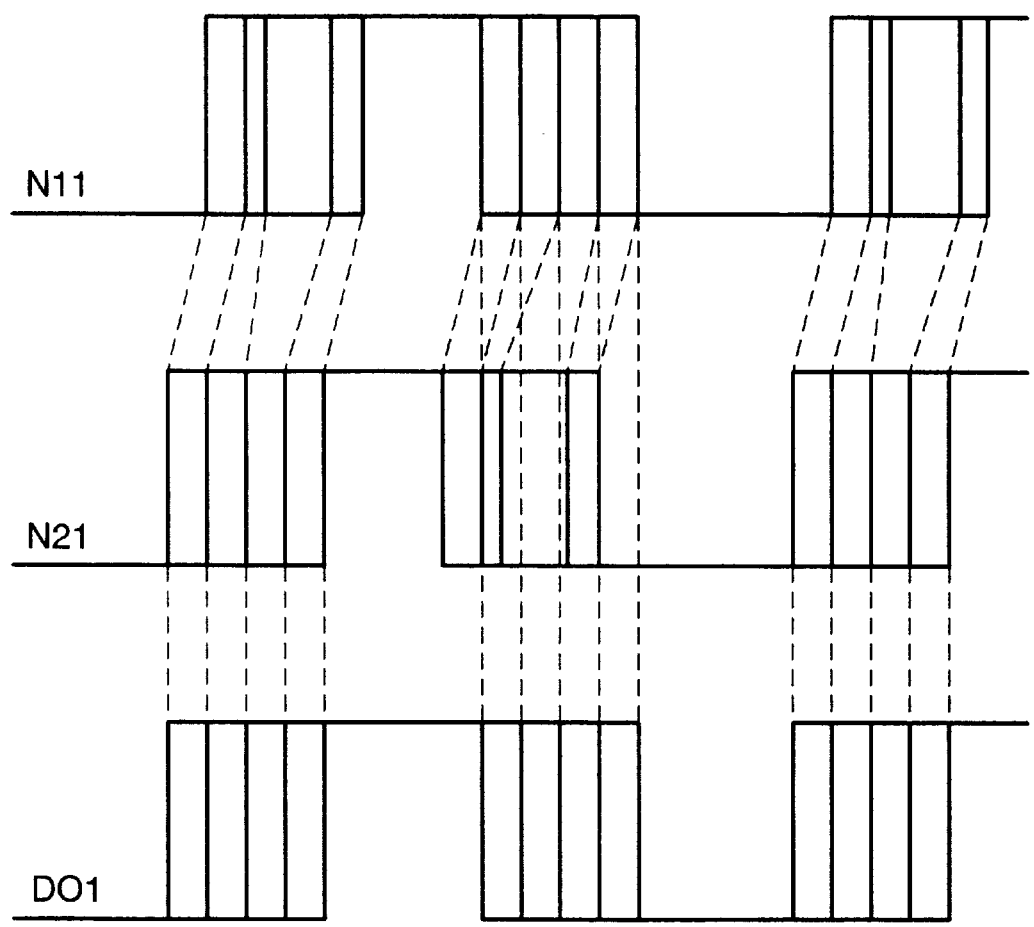
FIG. 11 is a timing chart showing an input and output signal of the OR circuit OR1.

The OR circuit OR1 in the embodiment, however, has the above-mentioned structure, and performs the same timing operation on two input signals. Namely, since the circuitry is identical in the positive logic variable delay circuit 1 and the negative logic variable delay circuit 2, the same timing is obtained. FIG. 11 is a timing chart showing an input and output signal of the OR circuit OR1.

Figure 12:
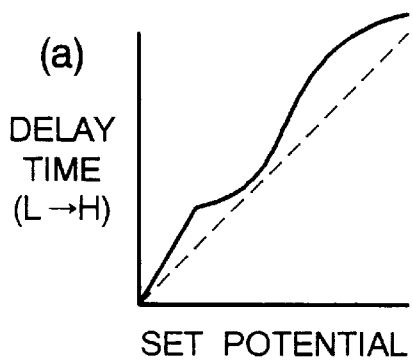
FIG. 12 is a graph showing the relationship between the analog output setting potential and the delay time at various edges.
Figure 12:
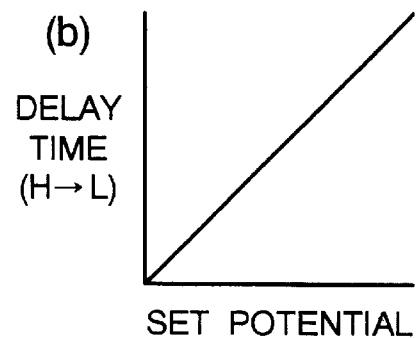
Figure 12:
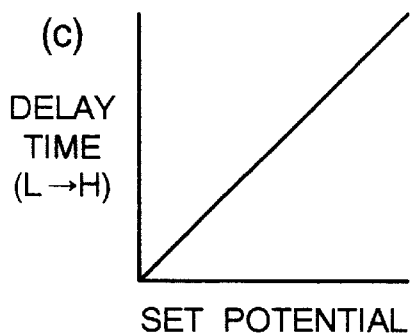
Figure 12:
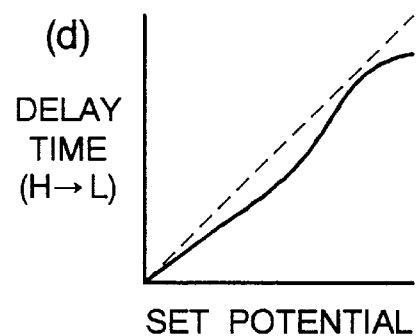
Figure 12:
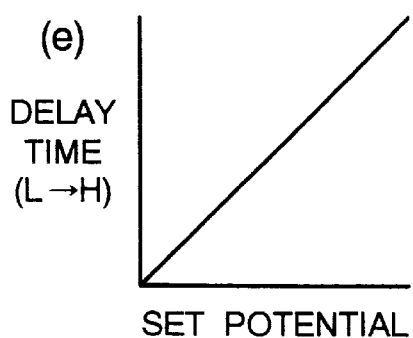
Figure 12:
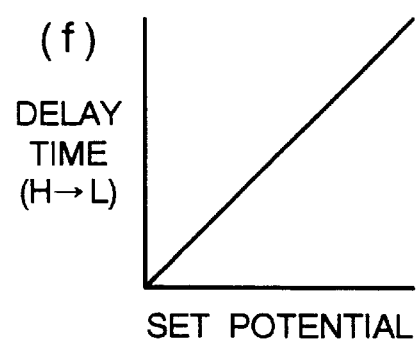

FIG. 12 is a graph showing the relationship therebetween with the analog output setting potential fixed as a horizontal axis and the delay time fixed as a vertical axis; FIG. 12(a) shows the L→H edge in the node N11, FIG. 12(b) shows the H→L edge in the node N11, FIG. 12(c) shows the L→H edge in the node N21, FIG. 12(d) shows the H→L edge in the node N21, FIG. 12(e) shows the L→H edge in the output terminal DO1, and FIG. 12(f) shows the H→L edge in the output terminal DO1. In FIGS. 12(a) to (f), the analog output potential is lower at the right side.

A signal is entered into the OR circuit OR1 from the node N11 and N21, and in the node N11, deviation of the delay occurs only at the L→H edge by an effect of an overshoot, as illustrated in FIG. 11 and FIGS. 12(a) and 12(b). While, in the node 21, deviation of the delay occurs only at the H→L edge by an effect of an overshoot, as illustrated in FIG. 11 and FIGS. 12(c) and (d).

In the embodiment, however, since such delay is intentionally and properly changed, by requiring OR of the both delay, only the edge having a correct delay will appear in the output terminal DO1, as illustrated in FIG. 11 and FIGS. 12(e) and (f).

In the conventional variable delay circuit, when (Vc–Va) is defined as 50 mV, (Va–Vb) is defined as 5 mV, the operating frequency is defined as 250 MHz, the variable delay is defined as 1 ns, and the resolution is defined as 15.6 ps, deterioration in the duty ratio and the linearity occurs to the following degree at the maximum; the duty ratio becomes 50.2:49.8% to 47.5:52.5%, and the linearity becomes +6.4 (LSB : Least Significant Bit) to –0.6 (LSB). Converting this to the delay, it corresponds to the deviation of +100 ps to –10 ps from the established delay time. Now that an LSI tester needs accuracy of about 10 ps at the present, this deterioration of a variable delay circuit has a serious effect on the performance of the LSI tester which depends on the various delay circuit. The embodiment, however, won't generate this deterioration.

Figure 13:
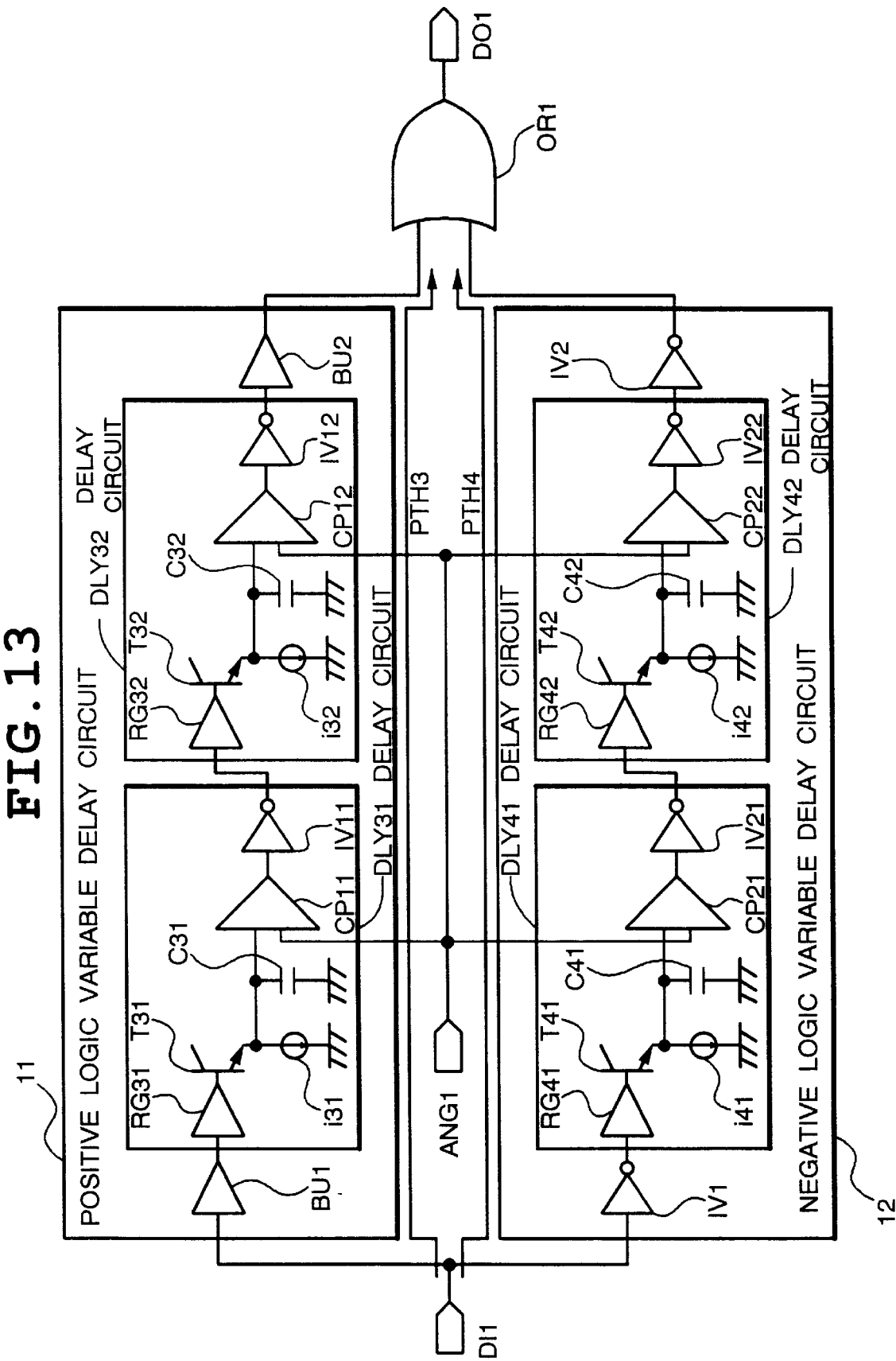
FIG. 13 is a circuit diagram showing a variable delay circuit according to a second embodiment of the present invention.

This time, a second embodiment of the present invention will be described. In the embodiment, an edge is properly delayed by properly setting the current value for discharging the electric charge within the ramp generator from the constant-current power. FIG. 13 is a circuit diagram showing a variable delay circuit according to the second embodiment of the present invention. In the second embodiment shown in FIG. 13, the description of the same components as those in the first embodiment will be omitted with the same reference numerals attached thereto.

In this embodiment, the same is each capacity C0 of the capacitive elements C31, C32, C41, and C42 respectively provided in the variable delay circuits DLY31 and DLY32 within the positive logic variable delay circuit 11 and in the variable delay circuits DLY41 and DLY42 within the negative logic variable delay circuit 12. On the other hand, the current value of each constant-current power provided in each variable delay circuit is various. That is, the current value of the constant-current power i31 within the variable delay circuit DLY31 and the current value of the constant-current power i41 within the variable delay circuit DLY41 are both i0, the current value of the constant-current power i32 within the variable delay circuit DLY32 is i1, and the current value of the constant-current power i42 within the variable delay circuit DLY42 is i2. The relation shown by the following expressions (15) and (16) holds among these values.

$$i1 \leq i0 - C0 \times (Va-Vb)/(T0-Ts) \quad (15)$$

$$i2 \leq i0 - C0 \times (Va-Vc)/(T0-Ts) \quad (16)$$

In FIG. 13, although the transistors T31, T32, T41, and T42 and the constant-current powers i31, i32, i41, and i42 are illustrated in the outside of the ramp generators RG31, RG32, RG41, and RG42 for convenience' sake, they are assembled as illustrated in FIGS. 3 and 4.

Also in thus-constituted embodiment, in each of the positive logic variable delay circuit 11 and the negative logic variable delay circuit 12, a difference occurs in the edges deviated from the delay time due to an overshoot, so that their OR is calculated by the OR circuit OR1. Thus, a correctly-delayed signal is supplied to the output terminal DO1.

Figure 14:
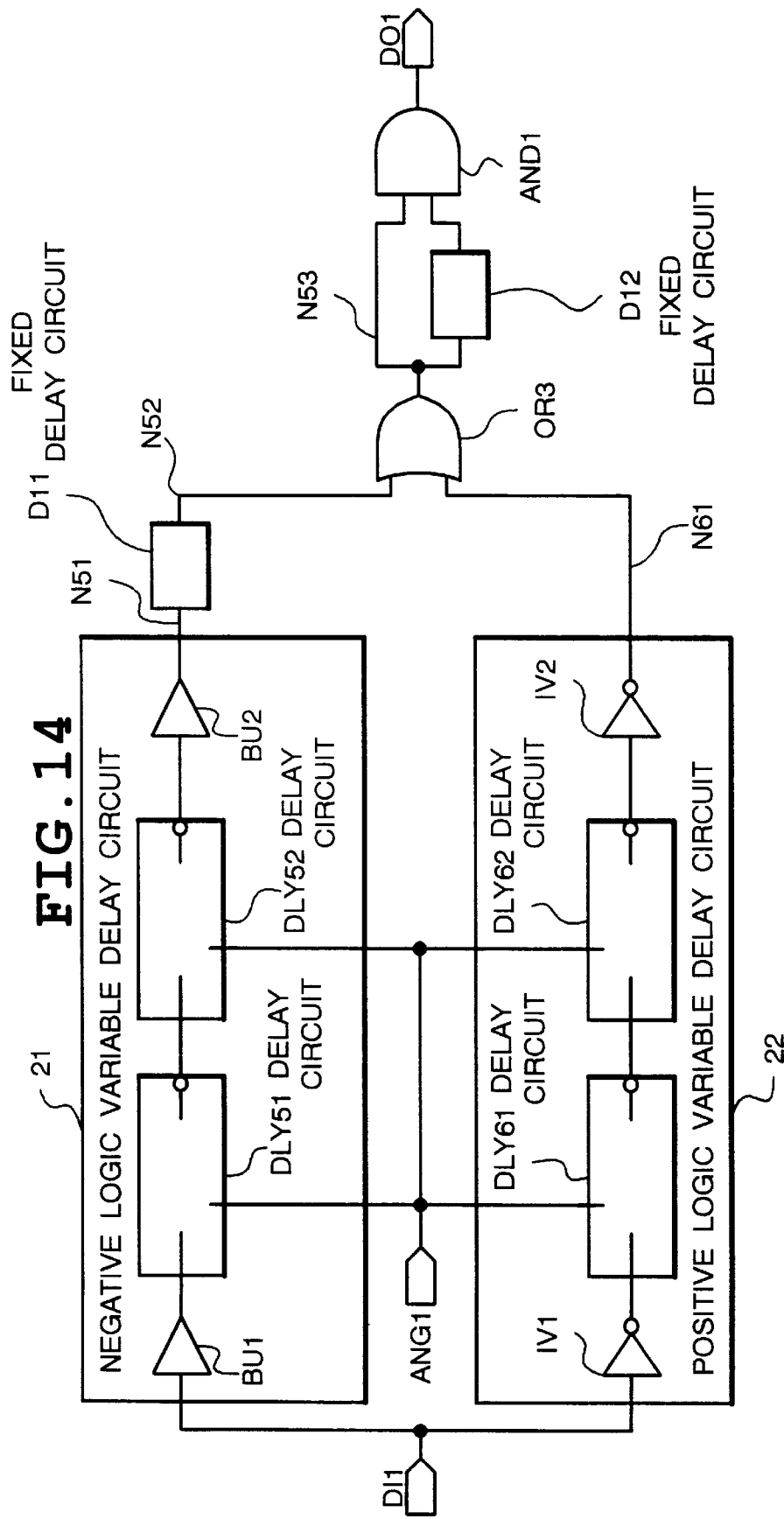
FIG. 14 is a circuit diagram showing a variable delay circuit according to a third embodiment of the present invention.

This time, a third embodiment will be described. In this embodiment, a fixed delay circuit is provided in the outside of the positive logic variable delay circuit and the negative logic variable delay circuit. FIG. 14 is a circuit diagram showing a variable delay circuit according to the third embodiment of the present invention. In the third embodiment shown in FIG. 14, the same components as those of the first embodiment shown in FIG. 1 will be omitted with the same reference numerals attached thereto.

In this embodiment, the variable delay circuits DLY51 and DLY52 within the positive logic variable delay circuit 21 and the variable delay circuits DLY61 and DLY62 within the negative logic variable delay circuit 22 have respectively the same structure. A fixed delay circuit D11 whose input side is connected to the output side of the buffer BU2 is provided there. The output side of the fixed delay circuit D11 is connected to the input side of the OR circuit OR3.

A signal line at the outside of the OR circuit OR3 is branched into two, and one of them is connected to the fixed delay circuit D12. The fixed delay circuit D11 has the same structure as that of the fixed delay circuit D12, and the delay time of D11 is in agreement with that of D12. Provided is an AND circuit AND1 whose input side is connected to the other signal line and the output side of the fixed delay circuit 12. The output side of the AND circuit AND1 is connected to the output terminal DO1.

Figure 15:
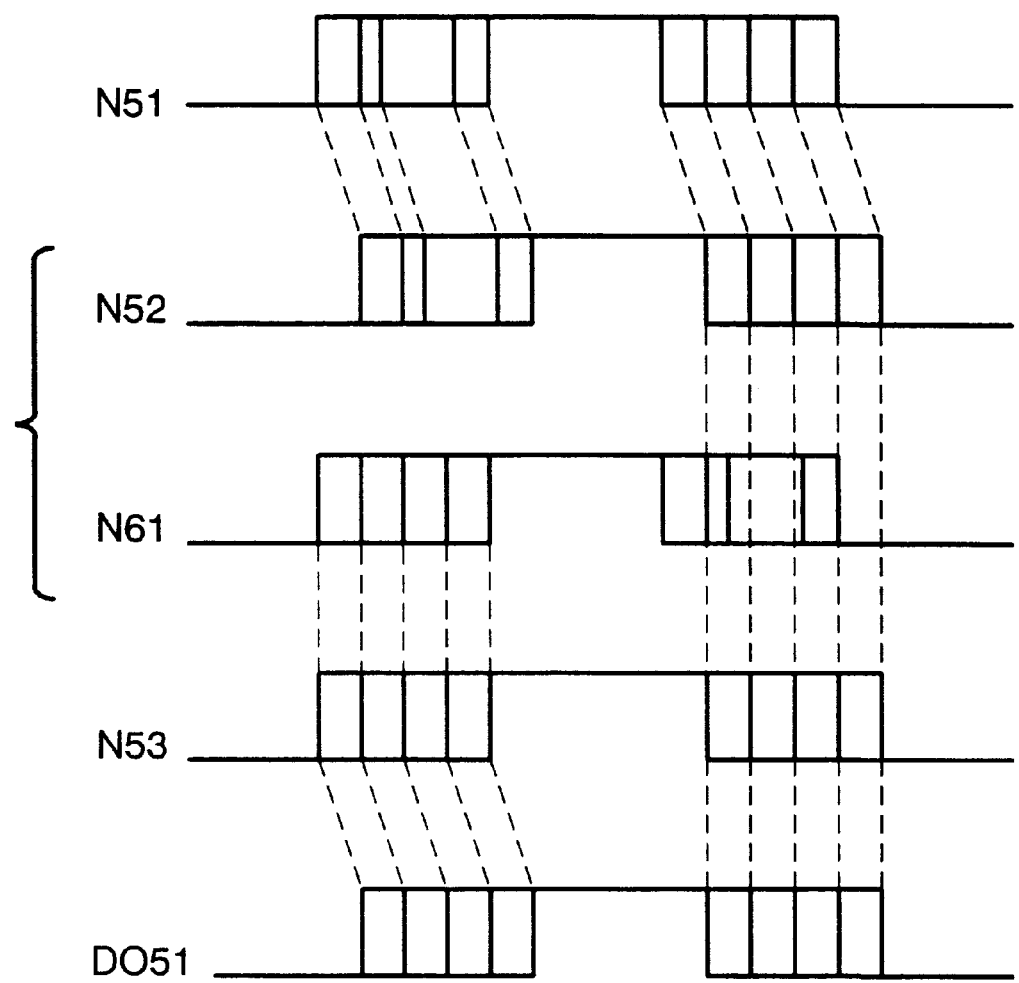
FIG. 15 is a timing chart showing the logic of a signal supplied from the positive logic variable delay circuit 21 and the negative logic variable delay circuit.
Figure 16:
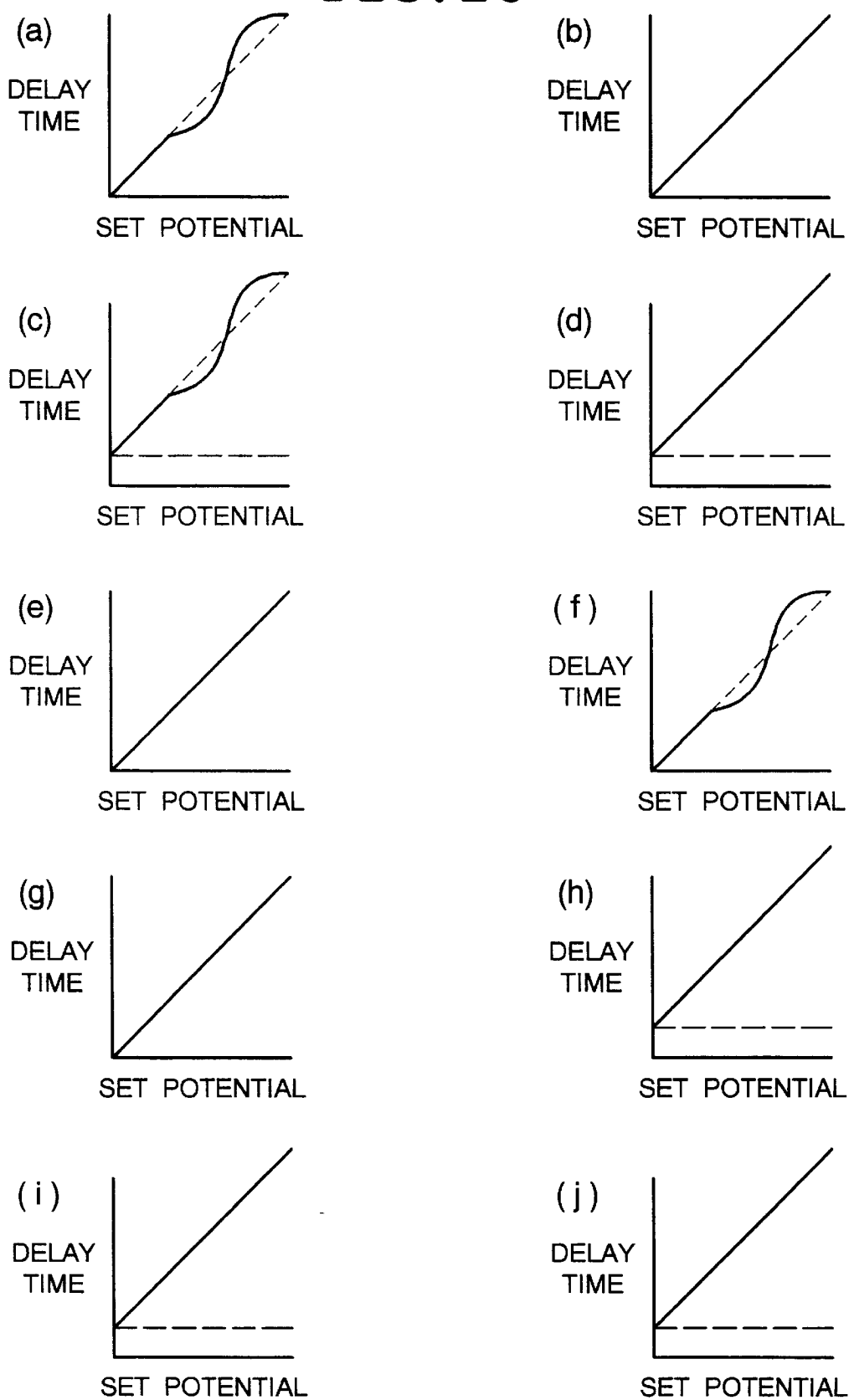
FIG. 16 is a graph showing the relationship between the analog output setting potential and the delay time at various edges.

FIG. 15 is a timing chart showing the logic of a signal supplied from the positive logic variable delay circuit 21 and the negative logic variable delay circuit 22. FIG. 16 is a graph showing the relationship therebetween with the analog output potential fixed as a horizontal axis and the delay time fixed as a vertical axis; FIG. 16(a) shows the L→H edge in the node N51, FIG. 16(b) shows the H→L edge in the node N51, FIG. 16(c) shows the L→H edge in the node N52, FIG. 16(d) shows the H→L edge in the node N52, FIG. 16(e) shows the L→H edge in the node N61, FIG. 16(f) shows the H→L edge in the node N61, FIG. 16(g) shows the L→H edge in the node N53, FIG. 16(h) shows the H→L edge in the node N53, FIG. 16(i) shows the L→H edge in the output terminal DO1, and FIG. 16(j) shows the H→L edge in the output terminal DO1. In FIGS. 16(a) to (j), the analog output potential is lower at the right side.

According to thus-constituted third embodiment, in a signal supplied from the positive logic variable delay circuit 21, both the L→H edge and H→L edge are delayed by a constant hour by the fixed delay circuit D11 as illustrated in FIG. 15 and FIGS. 16(a) to (d). The signal is ORed with the signal in which deviation of the delay occurs at the H→L edge by the OR circuit OR3, as illustrated in FIG. 15 and FIGS. 16(e) and (f).

Thus, though the OR circuit OR3 extracts only the correctly-delayed edge, the pulse width gets thicker by the delay by the fixed delay circuit 11, as illustrated in FIG. 15 and FIGS. 16(g) and (h). Thereafter, a signal supplied from the OR circuit OR3 is branched into two, and one of them is delayed the fixed delay circuit D12 by the same hour as that in the fixed delay circuit D11. Their AND is computed by the AND circuit AND1, thereby to return the pulse width as it is, as illustrated in FIG. 15 and FIGS. 16(i) and (j). Namely, the correctly-delayed signal without any change in the pulse width is supplied to the output terminal DO1.

The respective delay time in the fixed delay circuit D11 and the fixed delay circuit D12 must be in agreement, and in the L→H edge and in the H→L edge, however, the delay time need not be in agreement.

Figure 17:
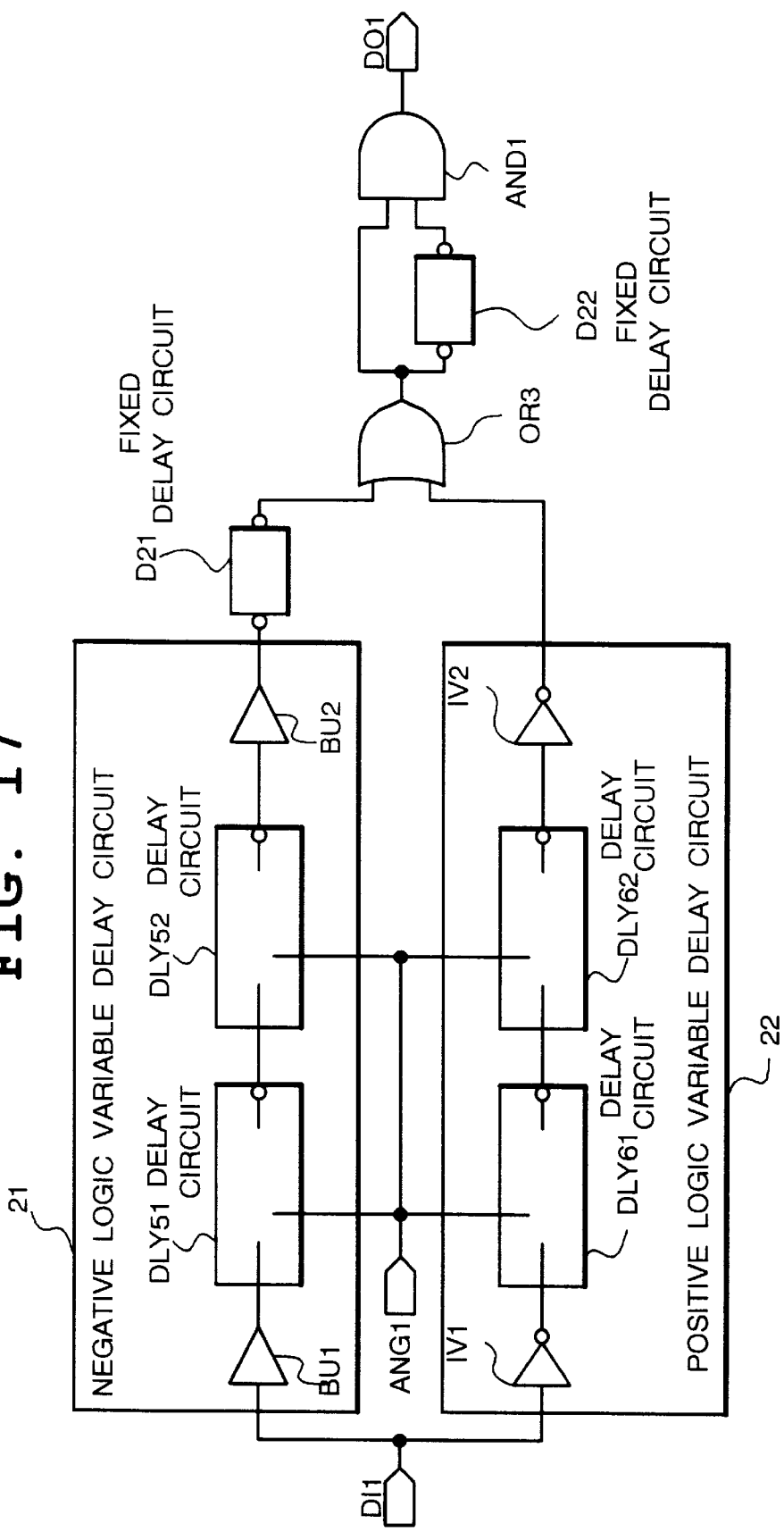
FIG. 17 is a circuit diagram showing a variable delay circuit according to fourth embodiment of the present invention.
Figure 18:
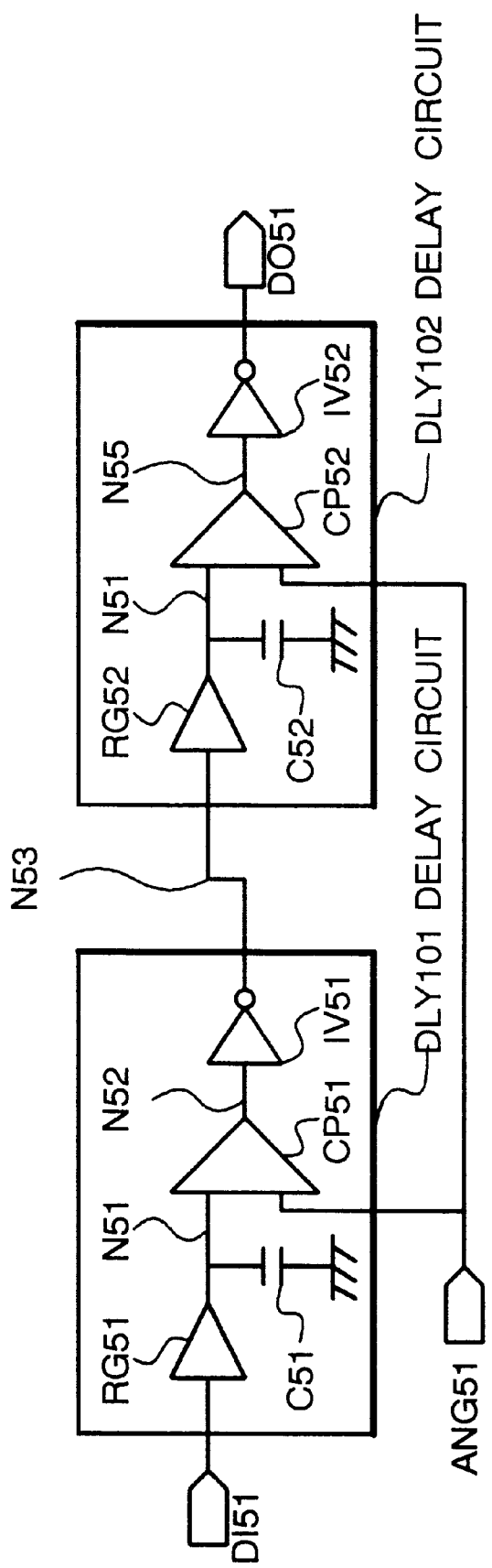
FIG. 18 is a circuit diagram showing the conventional variable delay circuit.
Figure 19:
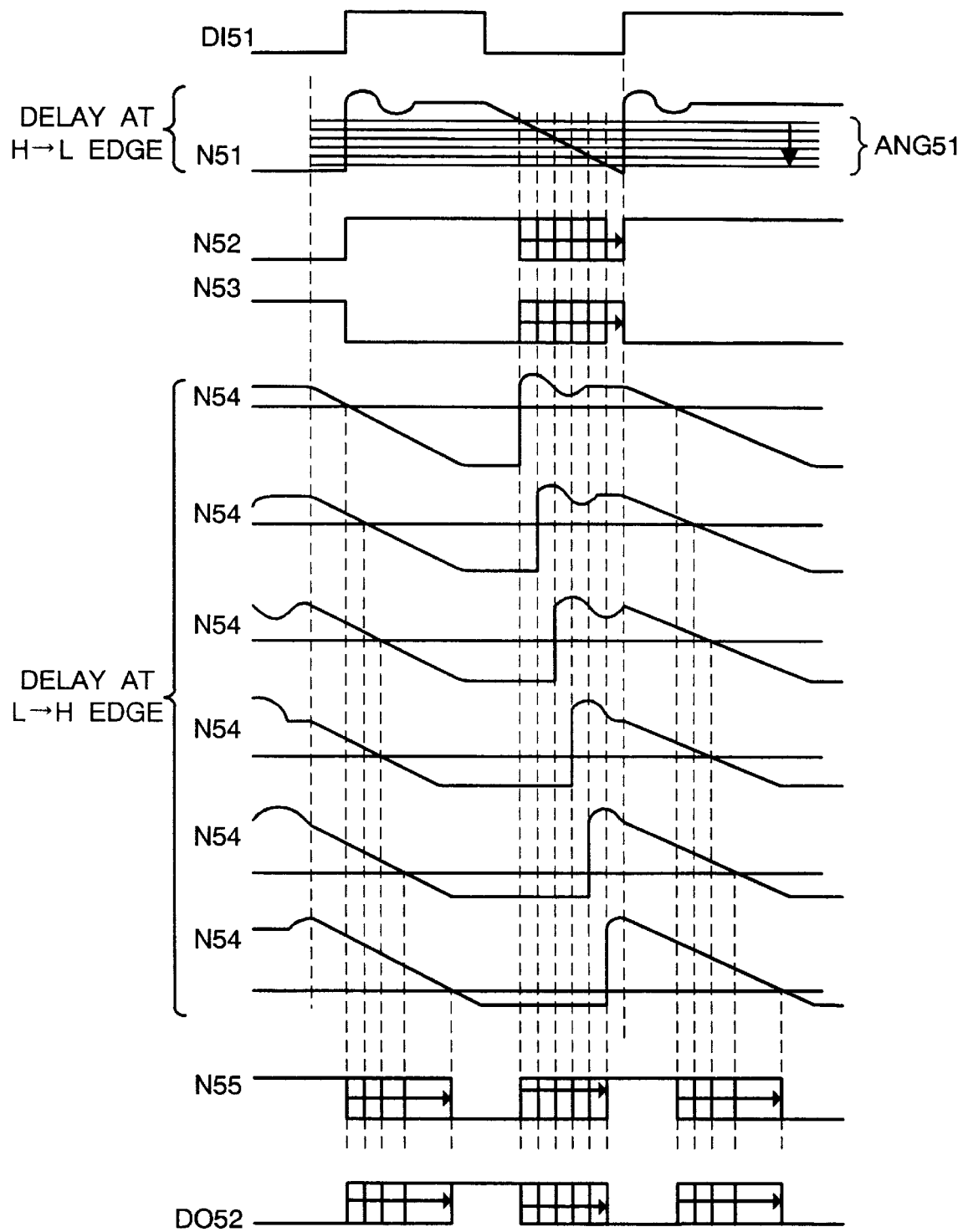
FIG. 19 is a timing chart showing a signal transferred within the conventional variable delay circuit.
Figure 20:
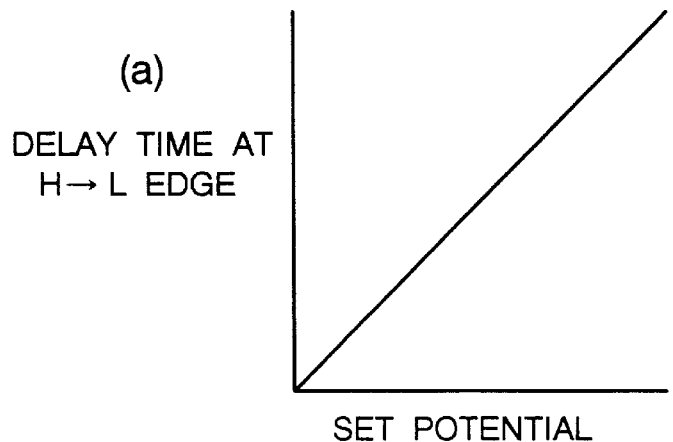
FIG. 20 is a graph showing the relationship between the analog output setting potential and the delay time at the H→L edge and L→H edge.
Figure 20:
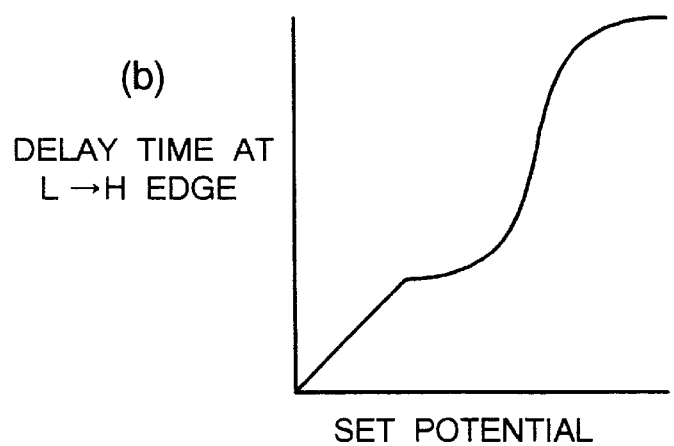
Figure 21:
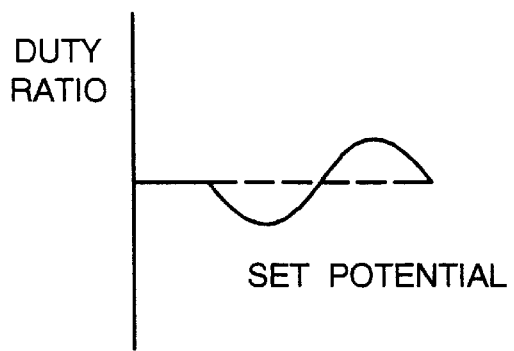
FIG. 21 is a graph showing the relationship between the analog output setting potential and the duty ratio.

Although the description of the third embodiment has been made in case of using the L→H edge, it is also possible to use only the H→L edge. FIG. 17 is a circuit diagram showing a variable delay circuit according to a fourth embodiment of the present invention. In the fourth embodiment shown in FIG. 17, the description of the same components as those of the third embodiment shown in FIG. 14 will be omitted with the same reference numerals attached thereto.

In this embodiment, instead of the fixed delay circuit D11 and D12, fixed delay circuits D21 and D22 are provided, and before and after them the logic inversion is performed.

The fourth embodiment thus constituted performs the substantially same operation as that of the third embodiment. Therefore, the correctly-delayed signal without any change in the pulse width is supplied to the output terminal DO1.

In the third embodiment and the fourth embodiment, the delayed amount of the respective fixed delay circuits needs to be the maximum value and the more of the deviation generated by an effect of an overshoot.

Further, in the respective OR circuit and AND circuit, the delay time from input to output needs to be in agreement.

Further, it is possible to constitute a variable delay circuit by use of the PNP transistor. In this case, an edge possible to be delayed is the L→H edge in the basic delay circuit. Therefore, the ramp waveform becomes such a shape as changing linearly at the L→H edge. Instead of the description so far as "deviation of the delay due to an overshoot", "deviation of the delay due to an undershoot" is applied. The other operation, the method of calculating the capacity of a capacitive element, and the method of calculating the current value are the same as described hereinabove.

As set forth hereinabove, the present invention duplicates a variable delay circuit as a positive logic variable delay circuit and a negative logic variable delay circuit, thereby preventing from deterioration of the duty ratio and the linearity in a supplied signal even if there occurs an edge whose delay is deviated due to an overshoot. Therefore, the delay time can be accurately established even if speed-up.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes delay time increasing means for making more than the set time, the delay time of an edge, varying from a low level to a high level, of the signal inputted through said input terminal, while
said negative logic variable delay circuit includes delay time decreasing means for making less than the set time, the delay time of an edge, varying from a high level to a low level, of the signal inputted through said input terminal.

2. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes delay time increasing means for making more than the set time, the delay time of an edge, varying from a low level to a high level, of the signal inputted through said input terminal, while
said negative logic variable delay circuit includes delay time decreasing means for making less than the set time, the delay time of an edge, varying from a high level to a low level, of the signal inputted through said input terminal, and
said extracting circuit is an OR circuit which computes OR of the signal supplied from said positive logic variable delay circuit and the signal supplied from said negative logic variable delay circuit.

3. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes delay time increasing means for making more than the set time, the delay time of an edge, varying from a low level to a high level, of the signal inputted through said input terminal, while said negative logic variable delay circuit includes delay time decreasing means for making less than the set time, the delay time of an edge, varying from a high level to a low level, of the signal inputted through said input terminal, said delay time increasing means and said delay time decreasing means respectively including a capacitive element and adjusting the delay time by setting the capacity of the capacitive element.

4. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes a first delay circuit for delaying an edge, varying from a high level and a low level, of the signal inputted through said input terminal and supplying the logic being inverted, and a second delay circuit for delaying an edge, varying from a high level to a low level, of a signal supplied from said first delay circuit and supplying the logic being inverted, while said negative logic variable delay circuit includes a first inverter for inverting the logic of the signal inputted through said input terminal, a third delay circuit for delaying an edge, varying from a high level to a low level, of a signal supplied from said first inverter and supplying the logic being inverted, a fourth delay circuit for delaying an edge, varying from a high level to a low level, of a signal supplied from said third delay circuit and supplying the logic being inverted, and a second inverter for inverting the logic of a signal supplied from said fourth delay circuit.

5. The variable delay circuit as set forth in claim 4, wherein said positive logic variable delay circuit includes a buffer whose operating speed is equal to the addition of the operating speed of said first inverter and that of said second inverter.

6. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes delay time increasing means for making more than the set time, the delay time of an edge, varying from a low level to a high level, of the signal inputted through said input terminal, a first delay circuit for delaying an edge, varying from a low level to a high level, of the signal inputted through said input terminal and supplying the logic being inverted, and a second delay circuit for delaying an edge, varying from a high level to a low level, of a signal supplied from said first delay circuit and supplying the logic being inverted, while said negative logic variable delay circuit includes delay time decreasing means for making less than the set time, the delay time of an edge, varying from a high level to a low level, of the signal inputted through said input terminal, a first inverter for inverting the logic of a signal input through said input terminal, a third delay circuit for delaying an edge, varying from a high level to a low level, of a signal supplied from said first inverter and supplying the logic being inverted, a fourth delay circuit for delaying an edge, varying from a high level to a low level, of a signal supplied from said third delay circuit and supplying the logic being inverted, and a second inverter for inverting the logic of a signal supplied from said fourth delay circuit.

7. The variable delay circuit as set forth in claim 6, wherein said delay time increasing means and said delay time decreasing means respectively include a capacitive element and adjust the delay time by setting the capacity of the capacitive element.

8. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes
a first delay circuit for delaying an edge, varying from a high level to a low level, of the signal inputted through said input terminal and supplying the logic being inverted, and
a second delay circuit for delaying an edge, varying from a high level to a low level, of a signal supplied from said first delay circuit and supplying the logic being inverted, while said negative logic variable delay circuit includes
a first inverter for inverting the logic of the signal inputted through said input terminal,
a third delay circuit for delaying an edge, varying from a high level to a low level, of a signal supplied from said first inverter and supplying the logic being inverted,
a fourth delay circuit for delaying an edge, varying from a high level to a low level, of a signal supplied from said first inverter and supplying the logic being inverted,
a second inverter for inverting the logic of a signal supplied from said fourth delay circuit,
said first delay circuit including
a first capacitive element which is charged upon receipt of an edge varying from a low level to a high level and discharged upon receipt of an edge varying from a high level to a low level,
said second delay circuit including
a second capacitive element which is charged upon receipt of an edge varying from a low level to a high level and discharged upon receipt of an edge varying from a high to a low level,
said third delay circuit including
a third capacitive element which is charged upon receipt of an edge varying from a low level to a high level and discharged upon receipt of an edge varying from a high to a low level,
said fourth delay circuit including
a fourth capacitive element which is charged upon receipt of an edge varying from a low level to a high level and discharged upon receipt of an edge varying from a high level to a low level.

9. The variable delay circuit as set forth in claim 8, wherein
the capacity of said first capacitive element is equal to that of said third capacitive element, the capacity of said second capacitive element is greater than that of said first capacitive element and said third capacitive element, and the capacity of said fourth capacitive element is smaller than that of said first capacitive element and said third capacitive element.

10. A variable delay circuit comprising:
an input terminal;
a positive logic variable delay circuit for delaying a leading edge of the signal inputted through said input terminal;
a negative logic variable delay circuit for delaying a trailing edge of the signal inputted through said input terminal; and
an extracting circuit for extracting only the edges delayed in accordance with a set time from the edges of a signal supplied from said positive logic variable delay circuit and the edges of a signal supplied from said negative logic variable delay circuit
wherein said positive logic variable delay circuit includes
a first delay circuit for delaying an edge, varying from a high level to a low level, of the signal inputted through said input terminal and supplying the logic being inverted, and
a second delay circuit for delaying an edge, varying from a high level to a low level, of a signal supplied from said first delay circuit and supplying the logic being inverted, while said negative logic variable delay circuit includes
a first inverter for inverting the logic of the signal inputted through said input terminal,
a third delay circuit for delaying an edge, varying from a high level to a low level, of a signal supplied for said first inverter and supplying the logic being inverted,
a fourth delay circuit for delaying an edge, varying from a high level to a low level, of a signal supplied from said third delay circuit and supplying the logic being inverted, and
a second inverter for inverting the logic of a signal supplied from said fourth delay circuit,
said first delay circuit including
a first capacitive element which is charged upon receipt of an edge varying from a low level to a high level and
a first constant-current power for discharging said first capacitive element upon receipt of a edge varying from a high level to a low level,
said second delay circuit including
a second capacitive element which is charged upon receipt of an edge varying from a low level to a high level and
a second constant-current power for discharging said second capacitive element upon receipt of an edge varying from a high to a low level,
said third delay circuit including
a third capacitive element which is charged upon receipt of an edge varying from a low level to a high level and
a third constant-current power for discharging said third capacitive element upon receipt of an edge varying from a high level to a low level,
said fourth delay circuit including
a fourth capacitive element which is charged upon receipt of an edge varying from a low level to a high level and
a fourth constant-current power for discharging said fourth capacitive element upon receipt of an edge varying from a high level to a low level.

11. The variable delay circuit as set forth in claim 10, wherein
the capacity of said first capacitive element is equal to that of said fourth capacitive element, the current of said first constant-current power is equal to that of said third constant-current power, the current of said second constant-current power is smaller than that of said first constant-current power and said third constant-current power, and the current of said fourth constant-current power is greater than that of said first constant-current power and said third constant-current power.

12. A variable delay circuit comprising:
an input terminal;
a positive logic variable delay circuit for delaying a leading edge of the signal inputted through said input terminal;
a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said extracting circuit includes
- a first fixed delay circuit for generating a constant delay on the signal supplied from said positive logic variable delay circuit,
- an OR circuit for calculating OR of a signal supplied from said first fixed delay circuit and the signal supplied from said negative logic variable delay circuit,
- a second fixed delay circuit for generating the constant delay on a signal supplied from said OR circuit, and
- an AND circuit for calculating AND of a signal supplied from said second fixed delay circuit and a signal supplied from said OR circuit.

13. A variable delay circuit comprising:

an input terminal;

a positive logic variable delay circuit for delaying a leading edge of the signal inputted through said input terminal;

a negative logic variable delay circuit for delaying a trailing edge of the signal inputted through said input terminal; and an extracting circuit for extracting only the edges delayed in accordance with a set time from the edges of a signal supplied from said positive logic variable delay circuit and the edges of a signal supplied from said negative logic variable delay circuit wherein said positive logic variable delay circuit includes
- delay time increasing means for making more than the set time, the delay time of the edge, varying from a low level to a high level, of the signal inputted through said input terminal, while said negative logic variable delay circuit includes
- delay time decreasing means for making less than the set time, the delay time of the edge, varying from a high level to a low level, of the signal inputted through said input terminal, and said extracting circuit includes
- a first fixed delay circuit for generating a constant delay on a signal supplied from said positive logic variable delay circuit,
- an OR circuit for calculating OR of a signal supplied from said first fixed delay circuit and a signal supplied from said negative logic variable delay circuit,
- a second fixed delay circuit for generating the constant delay on a signal supplied from said OR circuit, and
- an AND circuit for calculating AND of a signal supplied from said second fixed delay circuit and a signal supplied from said OR circuit.

\* \* \* \* \*